United States Patent [19]

Sato

[11] Patent Number: 5,409,790
[45] Date of Patent: Apr. 25, 1995

[54] PROCESS FOR FABRICATING MASKS FOR USE IN X-RAY LITHOGRAPHY

[75] Inventor: Junichi Sato, Tokyo, Japan

[73] Assignee: Sony Corporation, Tokyo, Japan

[21] Appl. No.: 202,011

[22] Filed: Feb. 25, 1994

[30] Foreign Application Priority Data

Mar. 2, 1993 [JP] Japan .................................. 5-041506

[51] Int. Cl.$^6$ .............................................. G03F 9/00
[52] U.S. Cl. .......................................... 430/5; 430/322; 430/323; 378/34; 378/35; 156/655; 156/662
[58] Field of Search ........................... 430/5, 322, 323; 378/34, 35; 156/655, 656, 643, 662

[56] References Cited

U.S. PATENT DOCUMENTS 5,312,518  5/1994  Kadomura ........................... 156/662
5,314,576  5/1994  Kadomura ........................... 156/655

Primary Examiner—S. Rosasco
Attorney, Agent, or Firm—Hill, Steadman & Simpson

[57] ABSTRACT

A process for fabricating a mask for use in X-ray lithography which comprises dry etching, with high selectivity, an X-ray absorbing metal layer on an X-ray transmitting film. The process comprises etching a tungsten film (an X-ray absorbing metal layer) formed on an SiN film (an X-ray transmitting film) using $S_2F_2$ gas. Since sulfur dissociates from $S_2F_2$ and deposits on the side wall of the pattern while the tungsten film is removed by forming a $WF_x$ compound, sulfur atoms in the plasma combine with the dangling bonds of the nitrogen atoms in the underlying SiN film which appear upon exposure to form a sulfur nitride based deposition layer comprising polythiazyl $(SN)_x$ as the principal constituent. Because the sulfur nitride based deposition layer protects the surface, etching with high base selectivity can be realized.

9 Claims, 2 Drawing Sheets

PROCESS FOR FABRICATING MASKS FOR USE IN X-RAY LITHOGRAPHY

BACKGROUND OF THE INVENTION

1. Field of the Invention

The present invention relates to a process for fabricating masks for use in X-ray lithography, and particularly, it relates to a technique for forming, with higher base selectivity, mask patterns by dry etching an X-ray absorbing metal layer on an X-ray transmitting film.

2. Prior Art

Semiconductor integrated circuits are becoming more highly integrated every year, and the degree of integration is stably increasing at a constant rate, i.e., it is doubled in three years. Accordingly, severer requirements are demanded for fine processing; for instance, a fine processing technology capable of realizing a pattern with a minimum line width of 0.2 $\mu$m or less is believed to be indispensable for the advanced device, i.e., a 64-M DRAM.

It can be safely said that the technological progress in lithography has played the main role in realizing such a high degree of integration. Near ultraviolet light, far ultraviolet light, and the like are used for exposure in the present day lithography. However, the resolution achievable with a beam of light in the aforementioned wavelength region is limited. Moreover, the use of a light with shorter wavelength lowers the depth of focus. This is another problem to be solved.

In the light of the aforementioned circumstances, X-ray lithography is extensively studied as an advanced technology in the field of lithography. Since an X ray is an electromagnetic wave having an ultra-short wavelength and a high power of penetration, fine processing call be effected, without being scattered by the substance and almost free from the influence of diffraction. Accordingly, a sufficiently long depth of focus can be attained without being influenced by the particles that are present on the wafer.

On the other hand, however, several problems must be overcome to put X-ray lithography into practice. One of the problems is the ultra-fine processing of the mask pattern. Since a reduced projection optical system is unfeasible in the case using X ray, the pattern transferred to the wafer must be the same as the mask pattern.

In general, a mask for use in X-ray lithography comprises an X-ray absorbing metal layer, an X-ray transmitting film to support the metal layer, and a frame to support the X-ray transmitting layer by the outer periphery.

The aforementioned X-ray absorbing metal layer is made of a heavy metal having a large atomic number, such as gold (Au), tungsten (W), and tantalum (Ta). Since the heavy metal layer is mainly processed these days by a dry process, representatively RIE (reactive ion etching), tungsten, tantalum, etc., are generally preferred to gold, because gold exhibits poor reactivity with other elements.

The X-ray transmitting film is made of a material having excellent transmittance of soft X rays. More specifically, compounds of relatively light elements such as silicon nitride (SiN), silicon carbide (SiC), and boron nitride (BN), are used.

The frame must be sufficiently rigid to support the X-ray transmitting film, and is made of a material which can be etched partially; usually, it is made of, e.g., Si.

When the X-ray absorbing metal layer is patterned by dry etching, a highly selective X-ray transmitting film must be provided as the underlying film. For instance, dry etching of a tungsten layer, which is a most commonly used X-ray absorbing film, must be performed by using a reaction product capable of yielding a sufficiently high vapor pressure. In this context, a fluorine-based compound is used as the etching gas to utilize fluorine radical (F*) as the principal etching species. When an SiN film is used as the underlining X-ray transmitting film, however, a sufficiently high base selectivity cannot be assured in a system using F* as the principal etching species unless some measure is taken to protect the surface. Still, none of the gases generally used in the field of dry etching provides a solution to this problem.

For instance, one may think of protecting the surface and the side walls by depositing carbon based polymers, thereby securing the high selectivity of the base layer. However, a process which generates particles at a large amount is not desired in the case of such a fine processing in which a minimum line width of 0.2 $\mu$m or less is implemented. As a matter of course, the use of chlorofluorocarbon (CFC) gas, i.e., the so-called Freon gas, must be left out of consideration from the viewpoint of the future regulations cast on Fleon gases.

One may otherwise propose the use of other halogen radicals such as Cl* and Br* as the principal etching species. However, the vapor pressure of the reaction products resulting from these halogen radicals, i.e., tungsten chloride ($WCl_x$) and tungsten bromide ($WBr_x$), is far lower than that of tungsten fluoride ($WF_x$). Accordingly, etching cannot be performed at a practically useful rate using halogen radicals other than of fluorine, unless a high ion energy is input to accelerate the dissociation into radicals. Accordingly, a high base selectivity cannot be achieved in the case halogen radicals other than those of fluorine are used.

SUMMARY OF THE INVENTION

Thus, an object of the present invention is to provide a process for fabricating a mask for use in X-ray lithography, by using dry etching.

The process for fabricating a mask for X-ray lithography according to the present invention has been proposed with an aim to accomplish the aforementioned object, and it comprises forming a desired X-ray absorbing pattern by selectively etching an X-ray absorbing metal layer provided on an X-ray transmitting film, wherein, the etching is performed using an etching gas comprising a composition capable of producing free sulfur (S) and a halogen chemical species in a plasma under the condition of discharge dissociation, thereby depositing at least sulfur on the region to be etched.

The present invention comprises depositing "at least sulfur", because if said X-ray transmitting film comprises nitrogen atoms, which case is described hereinafter, the exposed surface of the X-ray transmitting film can be partially covered with sulfur nitride based compound by deposition.

Free sulfur and a halogen chemical species as referred hereinbefore may be supplied from a single compound or separately from different compounds. When a single compound is used, more specifically, it is favorable to use sulfur halides such as sulfur fluorides ($S_2F_2$, $SF_2$, SF$_4$, and S$_2$F$_{10}$), as proposed in JP-A-4-84427 (the term "JP-A-" as referred herein signifies "an unexamined published Japanese patent application") submitted by the present inventors, or sulfur chlorides (S$_3$Cl$_2$, S$_2$Cl$_2$, and SCl$_2$) and sulfur bromides (S$_3$Br$_2$, S$_2$Br$_2$, and SBr$_2$) also proposed by the present inventors in Japanese patent application Hei-3-210516. These sulfur halides are composed of molecules having a relatively high S/X ratio (where, S represents the number of sulfur atoms and X represents the number of halogen atoms). Accordingly, they can readily discharge free sulfur into the plasma under discharge dissociation conditions, and, at the same time, supply halogen chemical species such as F*, Cl*, and Br*.

Another process according to the present invention comprises effecting a similar etching while depositing a sulfur nitride based compound on the area to be etched by using an etching gas comprising a composition capable of producing free sulfur, a halogen chemical species, and a nitrogen based chemical species in the plasma under the conditions of discharge dissociation.

The sulfur nitride based compound as referred herein typically refers to polythiazyl [(SN)$_x$], but it also includes compounds which are produced through a reaction between a sulfur chemical species and a nitrogen chemical species inside the etching reaction system, as well as various types of like compounds containing hydrogen atoms and halogen atoms. Specific examples include cyclic sulfur nitride compounds, imide compounds such as thiazyl hydride having hydrogen atoms combined with nitrogen atoms of the sulfur nitride based compounds, and thiazyl halide having halogen atoms combined with sulfur atoms of (SN)$_x$ compounds.

For the technology for improving the etching selectivity utilizing the deposition of the sulfur nitride based compounds above, reference can be made to JP-A-4-354331 of the present inventors.

Free sulfur, halogen chemical species, and nitrogen chemical species enumerated above can be used in any desired combination, and can be supplied from either a single compound or separately from a plurality of compounds. Preferred combination include a mixed system comprising one of the aforementioned sulfur halides and a nitrogen compound such as N$_2$, NF$_3$, and NCl$_3$.

The process according to the present invention comprises using, as the etching gas, a gas capable of producing a chemical species which traps the halide chemical species above. Specifically, usable chemical species include H*, CO*, and Si*.

Furthermore, a film of a material containing nitrogen is used as the X-ray transmitting film in the process according to the present invention. More specifically, usable films include those made of a material containing nitrogen atom as the element constituting the crystal structure, e.g., SiN, BN, and BNC, and a material into which nitrogen atoms are introduced by ion implantation.

The present inventors have extensively studied the feasibility of protecting the surface using a deposit which causes no particle pollution. As a result, special attention has been paid on sulfur and sulfur nitride based compounds. If the temperature of the substrate is maintained to about 90° C. or lower during etching, sulfur partly deposits on the substrate. Sulfur undergoes sublimation if the temperature of the substrate is raised to 90° C. or higher. Sulfur nitride based compounds deposit at a temperature of 130° C., and undergo sublimation or decomposition at temperatures higher than 130° C. In a plane perpendicular to the substrate, it can be seen that the deposited component contributes to the protection of side walls or to the shape control of the cross section. In a plane vertical to the incident ions, it also contributes to the increase of selectivity through the competition between deposition and removal by sputtering. Because the removal by sputtering is effected by sublimation and decomposition, there is no fear of causing particle pollution. If the process comprises resist ashing in the later steps, the deposit can be easily removed at the same time with the removal of resist mask by combustion.

By etching the X-ray absorbing metal layer provided on the X-ray transmitting film using an etching gas comprising a composition capable of generating free sulfur and a halogen chemical species in a plasma under the conditions of discharge dissociation, the etching of the X-ray absorbing metal layer can be effected while protecting the side walls of the mask pattern by a sulfur deposition layer.

Furthermore, by using an etching gas comprising a composition capable of generating a nitrogen-based chemical species in addition to the aforementioned free sulfur and a halogen chemical species, compounds based on sulfur nitride which generate inside the plasma can be obtained as a deposit on the side wall of the mask pattern.

In the plane perpendicular to the incident ion beam, etching proceeds because the thus deposited sulfur and sulfur nitride based compounds are removed immediately by sputtering. By optimizing the deposition rate and the energy of the incident ion beam, the X-ray absorbing metal layer can be etched favorably with high selectivity while maintaining a practical etching rate.

Furthermore, by using an etching gas capable of generating a chemical species capable of trapping a halogen chemical species in addition to free sulfur and a halogen chemical species, the deposition of sulfur or a sulfur based compound can be further accelerated to far increase the selectivity. For instance, if H* is added as the trapping chemical species to an etching reaction system comprising a halogen radical (X*) as the principal etching species, the reaction of forming a hydrogen halide proceeds according to the following equation: X* + H* ⇌ HX to remove X* out of the system. Then, the S/X ratio of the etching reaction system increases to facilitate the generation of S.

In addition, the present invention proposes a process which comprises using a material containing nitrogen as the X-ray absorbing metal layer to further increase the base selectivity. In this case, the exposed surface of the X-ray transmitting film can be covered by a deposition layer of a sulfur nitride based compound. More concretely, as the etching of the X-ray absorbing metal layer proceeds to reach the X-ray transmitting film, sulfur atoms inside the plasma combine with the dangling bonds of the nitrogen atoms of the X-ray absorbing metal layer exposed to the plasma. Since the surface protective layer thus formed by forming a sulfur nitride based compound is highly resistant against the attack of ions and radicals, a high base selectivity can be achieved.

BRIEF DESCRIPTION OF THE DRAWINGS

FIG. 1 shows a step sequential process for fabricating a mask for use in X-ray lithography, which comprises:

FIG. 2 is an enlarged cross section view for the structures shown in FIG. 1, which comprises:

DETAILED DESCRIPTION OF THE PREFERRED EMBODIMENTS

The present invention is described in further detail below referring to non-limiting examples below. It should be understood, however, that the present invention is not to be construed as being limited thereto.

The first embodiment according to the present invention comprises fabricating a mask for use in X-ray lithography, which comprises an SiN film as the X-ray transmitting film, and a tungsten film as the X-ray absorbing metal layer. In this embodiment, the etching of the tungsten film is effected using $S_2F_2$ gas. Referring to FIGS. 1 and 2, the process according to the first embodiment is described in detail below.

Figure 1A:
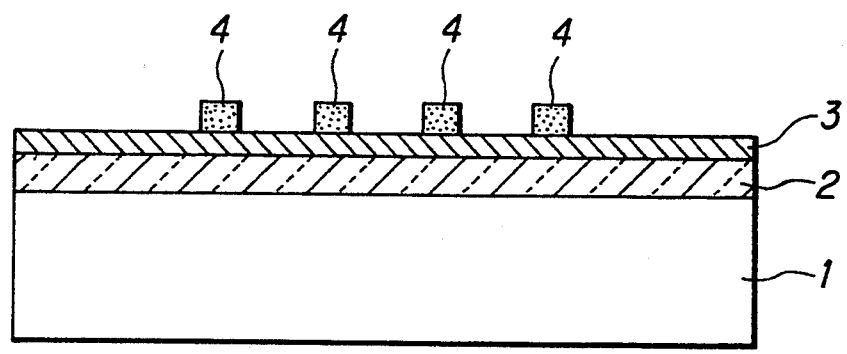
FIG. 1(a) showing a state of a mask substrate before etching, comprising an Si substrate having thereon an SiN film, a W film, and an electron-beam resist mask sequentially formed in this order.

Referring to FIG. 1(a), a mask substrate for use as the sample to be etched comprises, formed sequentially in this order, a Si substrate 1 having thereon an SiN film 2 about 2 μm in thickness and a tungsten (W) film 3 about 0.5 μm in thickness. An electron-beam resist mask 4 patterned by electron beam lithography is formed further on the tungsten film 3.

Figure 1B:
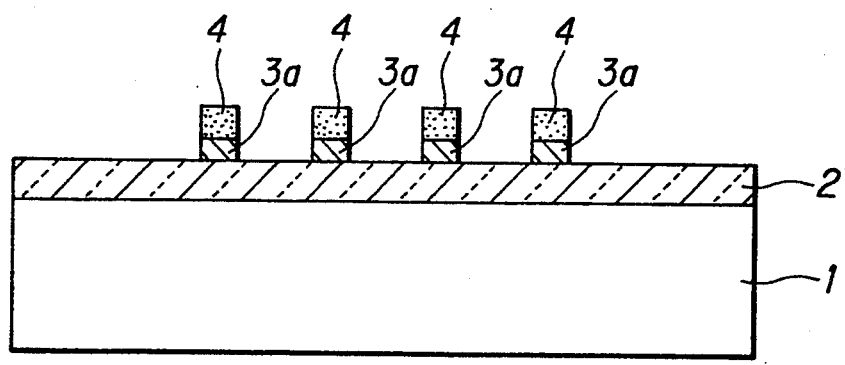
FIG. 1(b) showing a state having a patterned W film formed by etching.
Figure 1C:
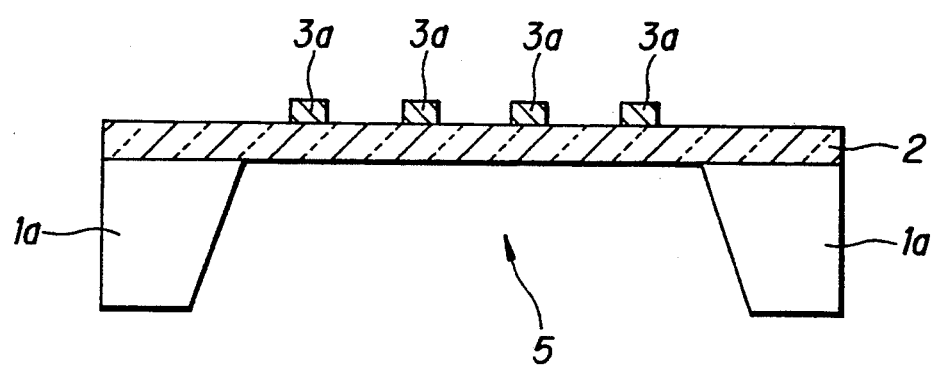
FIG. 1(c) showing a state after ashing the electron-beam resist mask, having an X-ray -transmitting region and a frame formed by etching the Si substrate.

The tungsten film 3 is set on an electrode for mounting thereon a substrate placed inside an RF-biased magnetic field microwave plasma etching apparatus. The temperature of the substrate can be maintained at a predetermined value by supplying a cooling medium from an external cooling system and circulating the medium inside a built-in cooling piping provided to the electrode for mounting thereon the substrate. Thus, the tungsten film is etched, for example, under an $S_2F_2$ gas flow of 5 sccm (standard cubic centimeters per minute) and a gas pressure of 1.33 Pa, while applying a microwave power of 850 W (2.45 GHz) and an RF bias power of 5 W (2 MHz), and maintaining the temperature of the electrode to 10° C. In this etching process, the tungsten film is allowed to react with F* produced from $S_2F_2$ to obtain a reaction product $WF_x$ having a high vapor pressure. Thus, $WF_x$ is rapidly removed from the reaction system to yield a patterned tungsten film 3a as shown in FIG. 1(b). The etching can thus be accomplished with high base selectivity, because the etching is stopped at the point the base SiN film 2 is exposed.

Referring to FIG. 2 which shows the enlarged view of the principal portion of the mask substrate shown in FIG. 1, the mechanism of the etching reaction is described in further detail below. The numerals in FIG. 2 each signify the same as those shown in FIG. 1.

Figure 2A:
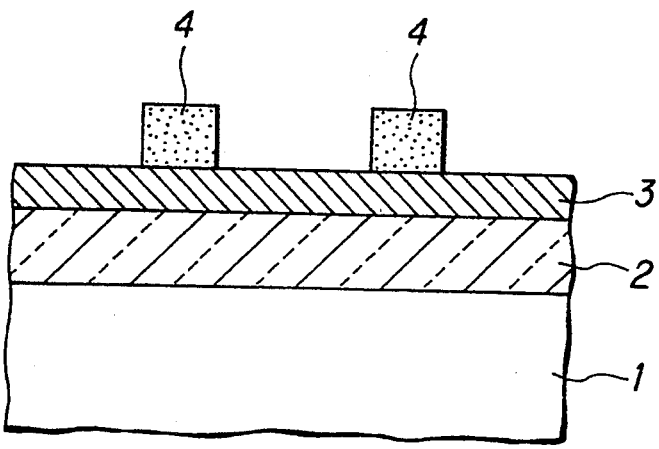
FIG. 2(a) showing a state of a mask substrate before etching.
Figure 2B:
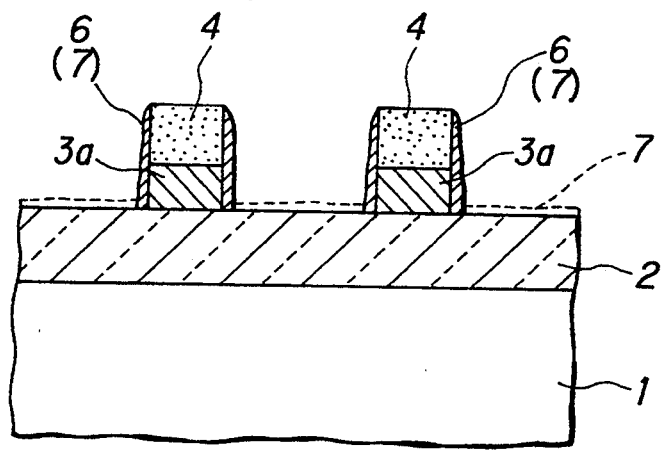
FIG. 2(b) showing a state comprising a sulfur deposit layer and a sulfur nitride based deposit layer, being formed with the formation of a patterned tungsten film.

FIG. 2(a) is an enlarged cross section view of the mask substrate before etching. When the tungsten film 3 is etched with $S_2F_2$ gas, sulfur deposits to form a sulfur deposit layer 6 on the vertical planes to which no perpendicular incident ion beam is applied. In this manner, a patterned tungsten film 3a having an anisotropic shape can be obtained. By thus protecting the side walls, a high base selectivity can be substantially achieved because the energy of the incident ion beam for anisotropic processing can be conserved. Once the SiN film 2 is exposed, furthermore, sulfur atoms inside the plasma combine with the dangling bonds of the nitrogen atoms of the exposed surface, or free nitrogen atoms from the SiN film combine with sulfur atoms inside the plasma to form a relatively stable sulfur nitride based deposition layer 7. Since the sulfur nitride based deposition layer 7 thus obtained exhibits an excellent resistance against etching, a further increased base selectivity can be achieved.

Figure 2C:
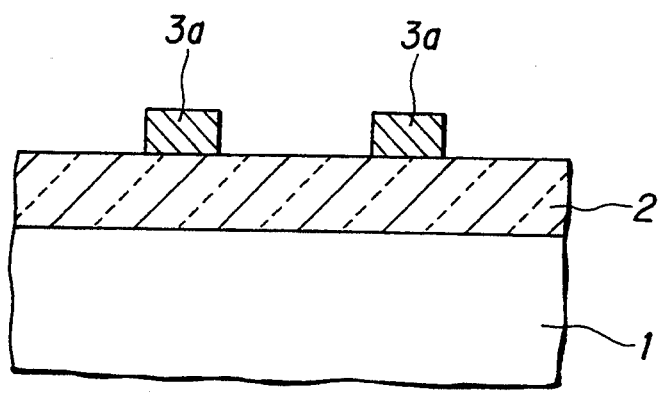
FIG. 2(c) showing a state after removing the sulfur deposit layer and the sulfur nitride based deposit layer together with the removal of the electron-beam resist mask.

The electron-beam resist mask 4 of the thus obtained structure is then subjected to ashing. As shown in FIG. 2(c), the sulfur deposition layer 6 and the sulfur nitride based deposition layer 7 are both removed instantaneously by combustion.

Subsequently, the back of the silicon substrate 1 is etched by the region of forming the patterned tungsten layer 3a to establish an X-ray transmitting area 5 and a frame 1a. Thus is obtained a complete mask for use in X-ray lithography.

An example according to a second embodiment of the present invention is described below.

The process is similar to that described in the first embodiment above, but the tungsten layer is etched using a mixed gas comprising $S_2F_2$ and $H_2$.

The same mask substrate as that used in the first embodiment, which reference can be made to FIG. 1(a), is set inside a microwave plasma etching apparatus under a magnetic field. Then, the tungsten film is etched, for example, under a mixed gas flow comprising $S_2F_2$ gas flown at a rate of 5 sccm and $H_2$ at a rate of 1 sccm at a gels pressure of 1.33 Pa, while applying a microwave power of 85.0 W (2.45 GHz) and an RF bias power of 5 W (2 MHz), and maintaining the temperature of the electrode to 20° C.

The mechanism for realizing an etching with high base selectivity is essentially the same as that explained with reference to the first embodiment. In this case, however, a part of F* is trapped and consumed by H* which generates from $H_2$ by dissociation. Accordingly, the S/F ratio (the ratio of the number of sulfur atoms to the number of fluorine atoms) is increased to facilitate the generation of sulfur.

In the present example, reference is specifically made to an etching gas composition comprising sulfur, a halogen chemical species (F*), and a chemical species (H*) for trapping the halogen chemical species. However, the four chemical species inclusive of nitrogen are supplied from an etching gas, and the etching gas may comprise component gases combined as desired. For example, nitrogen chemical species and a halogen chemical species which functions as the etching species, e.g., F*, can be obtained at the same time by using $NF_3$. By selecting $H_2S$, H* for trapping F*and free sulfur can be obtained from a single compound.

In the examples above, F* is used as the halogen chemical species because the etching of a tungsten film is specifically considered. As a matter of course, other halogen chemical species which yield a halide with a high vapor pressure can be selected as well if other heavy metal films are used for the X-ray absorbing metal layer.

Furthermore, in the examples above, the formation of an X-ray transmitting region on the substrate and a frame for supporting the X-ray transmitting layer is performed after ashing the resist. However, the sequential steps of forming the X-ray transmitting region and the frame can be conducted before initiating the etching of the X-ray absorbing metal layer.

The type of the etching apparatus, the structure of the masked substrate, etching conditions, and the like are all subject to modification.

In the examples above, the tungsten films are patterned into an anisotropic shape. However, the tungsten films may be processed to give, for example, a mask pattern with a forward tapered cross section as disclosed in JP-A-52416, thereby reducing the influence of Fresnel's diffraction when a parallel X ray such as that of a synchrotron radiation is used as the light source for exposure. A mask pattern having a forward tapered cross section can be readily obtained by the process according to the present invention by selecting the conditions as such capable of yielding sulfur and sulfur nitride based deposits at an amount slightly in excess.

An example according to a third embodiment of the present invention is described below.

The process is similar to that described in the first embodiment above, but the tungsten layer is etched using a mixed gas comprising $S_2F_2$ and $N_2$.

The same mask substrate as that used in the first embodiment, which reference can be made to FIG. 1(a), is set inside a microwave plasma etching apparatus under a magnetic field. Then, the tungsten film is etched, for example, under a mixed gas flow comprising $S_2F_2$ gas flown at a rate of 5 sccm and $N_2$ at a rate of 1.5 sccm at a gas pressure of 1.33 Pa, while applying a microwave power of 850 W (2.45 GHz) and an RF bias power of 5 W (2 MHz), and maintaining the temperature of the electrode to 30° C.

In this example, a strongly bonded $(SN)_x$ polymer 105 is found to form as a protective film on the side wall of the tungsten film 101. Accordingly, this enables anisotropic etching of the substrate with high base selectivity well comparable to that in the foregoing examples, yet at a higher temperature. The $(SN)_x$ polymer can be readily removed.

As described in the foregoing, the process for fabricating a mask for use in X-ray lithography according to the present invention enables, by taking advantage of the deposition of sulfur or a sulfur nitride based compound, the etching of an X-ray absorbing metal layer provided on an X-ray transmitting film to take place with high selectivity. Since the deposits above cause no particle pollution, the process is highly reliable and reproducible.

It can be seen therefore that the present invention is highly significant in bringing X-ray lithography into practice in the field of fine processing of future semiconductor devices.

While the invention has been described in detail and with reference to specific embodiments thereof, it will be apparent to one skilled in the art that various changes and modifications can be made therein without departing from the spirit and scope thereof.

What is claimed is:

1. A method for making an X-ray mask for use in X-ray lithography comprising: providing a mask substrate including a silicon substrate layer, an X-ray transmitting film layer selected from SiN and BN, an X-ray absorbing metal layer; and a patterned electron beam resist mask layer, and dry etching said X-ray absorbing metal layer to form a desired X-ray absorbing pattern using an etching gas composition capable of producing free sulfur and a halogen chemical specie in a plasma under discharge dissociation conditions in a manner which deposits at least sulfur on regions to be etched; and thereafter, removing the patterned resist mask layer and deposited sulfur to provide the X-ray mask.

2. A process for fabricating a mask for use in X-ray lithography as claimed in claim 1, wherein said etching gas produces, at the same time, a chemical species capable of trapping said halogen species.

3. A process for fabricating a mask for use in X-ray lithography as claimed in claim 1, wherein said etching gas comprises a gas component containing sulfur within the molecule, said gas component being at least one selected from a group consisting of $S_2F_2$, $SF_2$, $SF_4$, $S_2F_{10}$, $S_3Cl_2$, $S_2Cl_2$, $SCl_2$, and $S_2Br_2$.

4. A process for fabricating a mask for use in X-ray lithography as claimed in claim 1, wherein said etching gas comprises a gas component rich in sulfur, said gas component being a mixture of gases comprising a first gas at least one selected from a group consisting of $S_2F_2$, $SF_2$, $SF_4$, $S_2F_{10}$, $S_3Cl_2$, $S_2Cl_2$, $SCl_2$, and $S_{2BR2}$, and a second gas at least one selected from a group consisting of $H_2$, $H_2S$, and a silane compound.

5. A process for fabricating a mask for use in X-ray lithography as claimed in claim 1, wherein said etching gas comprises a gas component rich in sulfur, said gas component being a mixture of gases comprising a first gas at least one selected from a group consisting of $S_2F_2$, $SF_2$, $SF_4$, $S_2F_{10}$, $S_3Cl_2$, $S_2Cl_2$, $SCl_2$, and $S_2Br_2$, and a second gas at least one selected from a group consisting of $N_2$, $NH_3$, $NF_3$, and $NCl_3$.

6. A method as defined in claim 1, wherein said X-ray absorbing metal layer comprises tungsten.

7. A method for making an X-ray mask for use in X-ray lithography comprising: providing a mask substrate including a silicon substrate layer, an X-ray transmitting film layer selected from SiN and BN, an X-ray absorbing metal layer; and a patterned electron beam resist mask layer, and dry etching said X-ray absorbing metal layer to form a desired X-ray absorbing pattern using an etching gas composition capable of producing free sulfur, a halogen chemical species and a nitrogen-based chemical species in a plasma under discharge dissociation conditions in a manner which deposits at least a sulfur nitride-based compound on regions to be etched; and thereafter, removing the patterned resist mask layer and deposited sulfur to provide the X-ray mask.

8. A method as defined in claim 7, wherein said X-ray absorbing metal layer comprises tungsten.

9. A method as defined in claim 7, wherein said etching gas comprises $S_2F_2$ in combination with $N_2$, $H_2$, or mixtures of $N_2$ and $H_2$.

* * * * *